United States Patent
Aoyama

(10) Patent No.: US 8,380,150 B2
(45) Date of Patent: Feb. 19, 2013

(54) RECEIVED ELECTRIC FIELD INTENSITY ESTIMATING DEVICE AND RECEIVED ELECTRIC FIELD INTENSITY ESTIMATING PROGRAM

(75) Inventor: Akio Aoyama, Tokyo (JP)

(73) Assignee: NEC Corporation, Tokyo (JP)

( * ) Notice: Subject to any disclaimer, the term of this patent is extended or adjusted under 35 U.S.C. 154(b) by 820 days.

(21) Appl. No.: 12/514,155

(22) PCT Filed: Nov. 15, 2007

(86) PCT No.: PCT/JP2007/072158
§ 371 (c)(1),
(2), (4) Date: May 8, 2009

(87) PCT Pub. No.: WO2008/078470
PCT Pub. Date: Jul. 3, 2008

(65) Prior Publication Data
US 2010/0035569 A1 Feb. 11, 2010

(30) Foreign Application Priority Data
Dec. 26, 2006 (JP) ................................. 2006-349585

(51) Int. Cl.
*H04B 17/00* (2006.01)
(52) U.S. Cl. .................................................. 455/226.4
(58) Field of Classification Search .................. None
See application file for complete search history.

(56) References Cited

U.S. PATENT DOCUMENTS

| 6,512,917 B1 | 1/2003 | Hiramatsu |
| 6,912,375 B2 * | 6/2005 | Fujii ............................. 455/67.7 |
| 7,242,937 B2 * | 7/2007 | Obayashi ...................... 455/436 |
| 7,302,232 B2 * | 11/2007 | Takatori et al. .............. 455/63.4 |

FOREIGN PATENT DOCUMENTS

| EP | 1220475 | 7/2002 |
| EP | 1515394 | 3/2005 |
| JP | 06-222124 | 8/1994 |
| JP | 09-026449 | 1/1997 |
| JP | 2000-022611 | 1/2000 |

(Continued)

OTHER PUBLICATIONS

Shigeo Minami "Kagaku Keisoku no Tameno Hakei Data Shori", 8th edition, CQ Publishing Co., Ltd., Mar. 1, 1991, pp. 86 to 88.

(Continued)

*Primary Examiner* — Lincoln Donovan
*Assistant Examiner* — Khareem E Almo
(74) *Attorney, Agent, or Firm* — Young & Thompson

(57) ABSTRACT

A received electric field intensity estimates device estimaties a received electric field intensity when a signal is received, by using at least a gain in a transmitting direction indicating the direction of the receiver viewed from a transmitter's side from among gains in the individual directions of the antenna's directive pattern of a transmitter's antenna, and outputs the estimated intensity. The device includes: an averaging unit for averaging gains in the individual directions of the antenna's directive pattern within an angular range of an arrival wave angle indicating the direction of the signal arriving at the receiver, taken as the relevant direction; and a received electric field intensity calculation unit using at least the gain in the transmitting direction from among gains in the individual directions of the antenna's averaged directive pattern, and for outputting the result of the calculation as the estimated received electric field intensity.

8 Claims, 9 Drawing Sheets

FOREIGN PATENT DOCUMENTS

| | | |
|---|---|---|
| JP | 3092651 | 7/2000 |
| JP | 2000-252897 | 9/2000 |
| JP | 2001-358639 | 12/2001 |
| JP | 3403701 | 2/2003 |
| JP | 2003-069481 | 3/2003 |
| JP | 2003-318811 | 11/2003 |
| JP | 2003-318842 | 11/2003 |
| JP | 2004-120554 | 4/2004 |
| JP | 2004-247971 | 9/2004 |
| JP | 2005-065057 | 3/2005 |

OTHER PUBLICATIONS

International Search Report—PCT/JP2007/072158—Feb. 12, 2008.
Extended European Search Report dated Jul. 6, 2012, Application No. 07831888.8.

* cited by examiner

RECEIVED ELECTRIC FIELD INTENSITY ESTIMATING DEVICE AND RECEIVED ELECTRIC FIELD INTENSITY ESTIMATING PROGRAM

TECHNICAL FIELD

The present invention relates to a received electric field intensity estimating device and a received electric field intensity estimating program for estimating a received electric field intensity at the time when a signal transmitted from a transmitter is received by a receiver.

BACKGROUND ART

In cases where a deterministic propagation model, for example, a ray-trace algorithmic determination, is used, a conventional received electric field intensity estimating device calculates, for a number of elementary waves transmitted from a transmitter and received by a receiver, antenna gains in the receiver direction of the antenna of the transmitter (hereinafter, called "transmitter's antenna"), propagation losses, and losses resulting from reflection, diffraction and scattering caused due to the topography of the terrain and structures in the area from the transmitter to the receiver, and estimates a received electric field intensity on the basis of the result of the calculation (refer to Patent Document 1). FIG. 1 shows an example of elementary wave emanated from a transmitter and received by a receiver. According to the construction shown in FIG. 1, it is possible to carry out a received electric field intensity estimation with high accuracy.

In cases where a statistical propagation model, for example, the Okumura-Hata Formula, is used, a conventional received electric field intensity estimating device calculates antenna gains in the receiver direction of the transmitter's antenna, calculates propagation losses calculated in accordance with a propagation loss formula, and a propagation loss compensation value based on the land-use classification information (that is, information indicating an urban section, a suburban section and a forest section) for the section around the receiver, and estimates a received electric field intensity on the basis of the result of the calculation (refer to Patent Document 2). FIG. 2 shows an example of propagation loss compensation based on the land-use classification information. According to the construction shown in FIG. 2, it is possible to carry out a received electric field intensity estimation through small number of calculating processes.

However, regardless of the deterministic or statistical propagation model mentioned above, the conventional received electric field intensity estimating device carries out an averaging process or a median value calculating process on the received electric field intensity estimated in a predetermined section around the receiver so as to smooth variation in the received electric field intensity. FIG. 3 shows an example of averaging process performed on the received electric field intensity estimated in a predetermined section around a receiver.

FIG. 4 is a block diagram showing an example of the construction of a conventional received electric field intensity estimating device in the event of using a statistical propagation model, for example, the Okumura-Hata Formula.

As shown in FIG. 4, a conventional received electric field intensity estimating device includes transmitting position input unit 10, transmitting frequency input unit 11, transmitting power input unit 12, antenna's directive pattern input unit 13, receiving position input unit 14, propagation loss formula input unit 15, received electric field intensity calculation unit 16, and received electric field intensity averaging unit 17.

Hereinafter, operation of the received electric field intensity estimating device will be described with reference to FIG. 4.

First, transmitting position input unit 10, transmitting frequency input unit 11, transmitting frequency input unit 12, antenna's directive pattern input unit 13, transmitting position input unit 14, and propagation loss formula input unit 15 provide received electric field intensity calculation unit 16 with information input from external sources.

Received electric field intensity calculation unit 16 uses P[dBm] as the value of transmitting power of a signal from a transmitter, input from transmitting power input unit 12, and f[Hz] as the transmitting frequency of the signal from the transmitter, input from transmitting frequency input unit 11.

Subsequently, received electric field intensity calculation unit 16 calculates distance D[m] between a transmitting position and a receiving position and transmitting direction $\theta o$[degree] indicating the direction of a receiver viewed from the transmitter's side on the basis of the transmitting position information indicating the position of the transmitter, input from transmitting position input unit 10 and on the basis of the receiving position information indicating the position of the receiver, input from receiving position input unit 14.

Subsequently, received electric field intensity calculation unit 16 calculates gain $A(\theta o)$[dB] in transmitting direction $\theta o$[degree] of an antenna's directive pattern on the basis of the antenna's directive pattern of the transmitter's antenna input from antenna's directive pattern input unit 13.

Subsequently, received electric field intensity calculation unit 16 calculates propagation loss L=g(D,f)[dB] by using function g of propagation loss formula input from propagation loss formula input unit 15.

Subsequently, received electric field intensity calculation unit 16 calculates the propagation loss compensation value C[dB] by comparing land-use classification information for the area around the receiver input from an external source with a propagation loss compensation value table set for the land-use classification information.

Subsequently, received electric field intensity calculation unit 16 calculates received electric field intensity R[dBm] by the following equation 1, and provides received electric field intensity averaging unit 17 with the received electric field intensity R[dBm].

$$R = P + A - (L + C) \qquad \text{[Equation 1]}$$

As a final step, received electric field intensity calculation unit 16 provides received electric field intensity averaging unit 17 with the received electric field intensity R[dBm] calculated by the equation 1.

Received electric field intensity averaging unit 17 averages, on the basis of the received electric field intensity averaging section input from an external source, received electric field intensity R which is calculated for each receiver in a received electric field intensity averaging section, and outputs, as an estimated received electric field intensity, the value obtained from the averaging process to outside.

DISCLOSURE OF THE INVENTION

Problems to be Solved by the Invention

However, the above-described conventional received electric field intensity estimating device suffers from a number of drawbacks.

A first drawback to overcome is that the number of calculating processes increases in case of using a deterministic propagation model, for example, a ray-trace algorithmic determination. That is because, to perform a high accuracy estimation using the ray-trace algorithmic determination, it is required that calculations to determine the influence of reflection, diffraction and scattering caused due to the topography of the terrain and structures in the area should be performed for rays of significantly large number of elementary waves.

A second drawback to overcome is that the accuracy of estimation will deteriorate in case of using a statistical propagation model, for example, the Okumura-Hata Formula. That is because, differently from the above-mentioned ray-trace algorithmic determination, a propagation loss compensation process based on land-use classification information does not take into consideration gains in the direction of ray of elementary wave, that is, in the direction of reflection, diffraction and scattering points of the transmitter's antenna.

Especially, in case where a transmitter's antenna has an antenna's directive pattern with a half amplitude, that is, in case where an antenna's directive pattern has a sharp shape, the estimated received electric field intensity is significantly affected when consideration is not given to any gains in the direction of reflection, diffraction and scattering points of the transmitter's antenna. That is because, in the antenna's directive pattern that has a sharp shape, there exists a large difference between the antenna gain in the direction of reflection, diffraction and scattering points and the antenna gain in the receiver direction.

A third drawback to overcome is that, regardless of whether a propagation model is a deterministic or statistical one, averaging performed on received electric field intensities estimated in the section around a receiver causes low accuracy of estimation in a large number of places. That is because the averaged estimated received electric field intensity significantly varies if there exists a place in which variation of the estimated received electric field intensity is extremely large due to the topography of the terrain and structures in the area.

Patent Document 1: Japanese Patent Publication No. 3092651 (page 8, FIG. 10)

Patent Document 2: Japanese Patent Publication No. 343701 (page 5, FIG. 1)

DISCLOSURE OF THE INVENTION

Therefore, it is an object of the present invention to provide a received electric field intensity estimating device and a received electric field intensity estimating program capable of improving accuracy in estimating a received electric field intensity and reducing the number of calculating processes In order to accomplish the above object, a received electric field intensity estimating device of the present invention estimates a received electric field intensity at the time when a signal transmitted from a transmitter is received by a receiver, by using at least a gain in the transmitting direction indicating the direction of the receiver viewed from a transmitter's side from among gains in the individual directions of an antenna's directive pattern of a transmitter's antenna, and outputs the estimated received electric field intensity, wherein the received electric field intensity estimating device includes an averaging unit for averaging gains in the individual directions of the antenna's directive pattern within an angular range of an arrival wave angle indicating the direction of the signal arriving at the receiver from the transmitter, taken as the relevant direction, and a received electric field intensity calculation unit for calculating the received electric field intensity by using at least the gain in the transmitting direction from among gains in the individual directions of the antenna's averaged directive pattern, and for outputting the result of the calculation as the estimated received electric field intensity.

In order to accomplish the above object, a received electric field intensity estimating program of the present invention executes, in a computer for estimating a received electric field intensity at the time when a signal transmitted from a transmitter is received by a receiver, by using at least a gain in the transmitting direction indicating the direction of the receiver viewed from a transmitter's side from among gains in the individual directions of an antenna's directive pattern of a transmitter's antenna, and outputting the estimated received electric field intensity, a sequence of averaging gains in the individual directions of the antenna's directive pattern within an angular range of an arrival wave angle indicating the direction of the signal arriving at the transmitter from the receiver, taken as the relevant direction, and executes a sequence of calculating the received electric field intensity by using at least the gain in the transmitting direction from among gains in the individual directions of the antenna's averaged directive pattern, and for outputting the result of the calculation as the estimated received electric field intensity.

The received electric field intensity estimating device of the present invention is constituted to average gains in the individual directions of an antenna's directive pattern within an angular range of an arrival wave angle taken as the relevant direction and to estimate a received electric field intensity by using the gain in the transmitting direction of the antenna's averaged directive pattern.

Accordingly, the received electric field intensity estimating device of the present invention is equal to the received electric field intensity estimating device which combines rays in reflection, diffraction and scattering directions to reflect antenna gains in reflection, diffraction and scattering directions.

As described above, the received electric field intensity estimating device of the present invention is capable of estimating a received electric field intensity in which antenna gains in reflection, diffraction and scattering directions are reflected even without performing a plural number of calculations on rays, thereby reducing the number of calculating processes and improving accuracy of estimation.

BEST MODE FOR CARRYING OUT THE INVENTION

Hereinafter, exemplary embodiments of the present invention will be explained with reference to the accompanying drawings.

First Exemplary Embodiment

Figure 1:
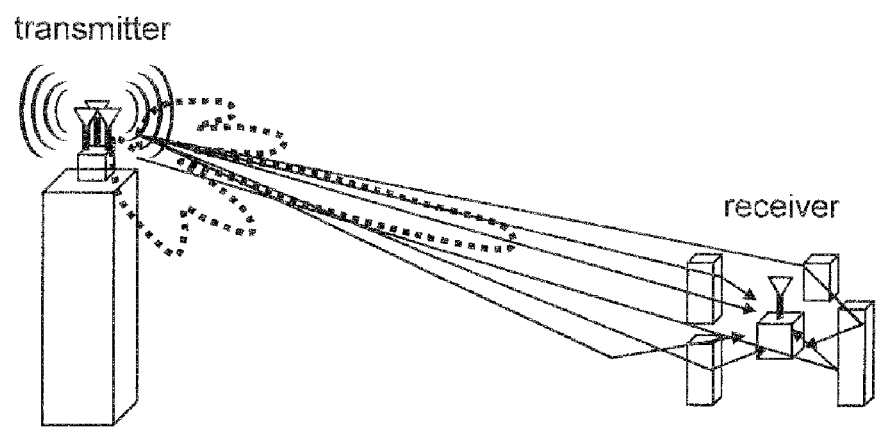
FIG. 1 A view showing an example of elementary wave transmitted from a transmitter and received by a receiver in case in which a deterministic propagation model is used, for example, a ray-trace algorithmic determination model.
Figure 2:
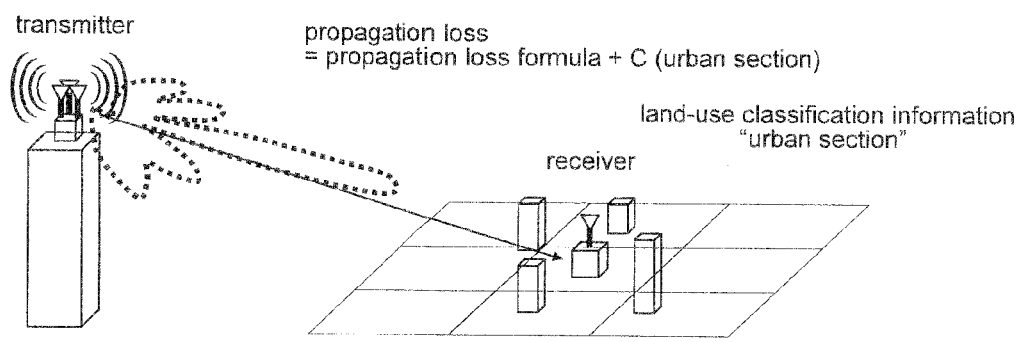
FIG. 2 A view showing an example of propagation loss compensation based on land-use classification information.
Figure 3:
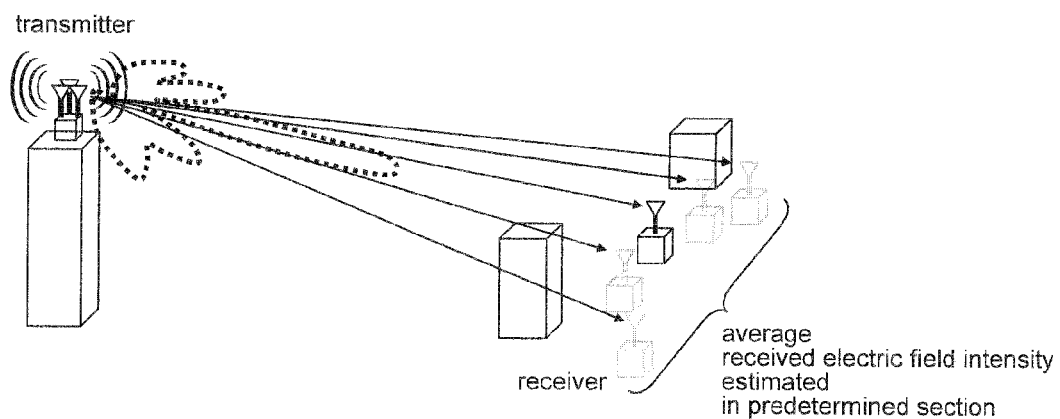
FIG. 3 A view showing an example of an averaging process performed on the received electric field intensity in a predetermined section around a receiver.
Figure 4:
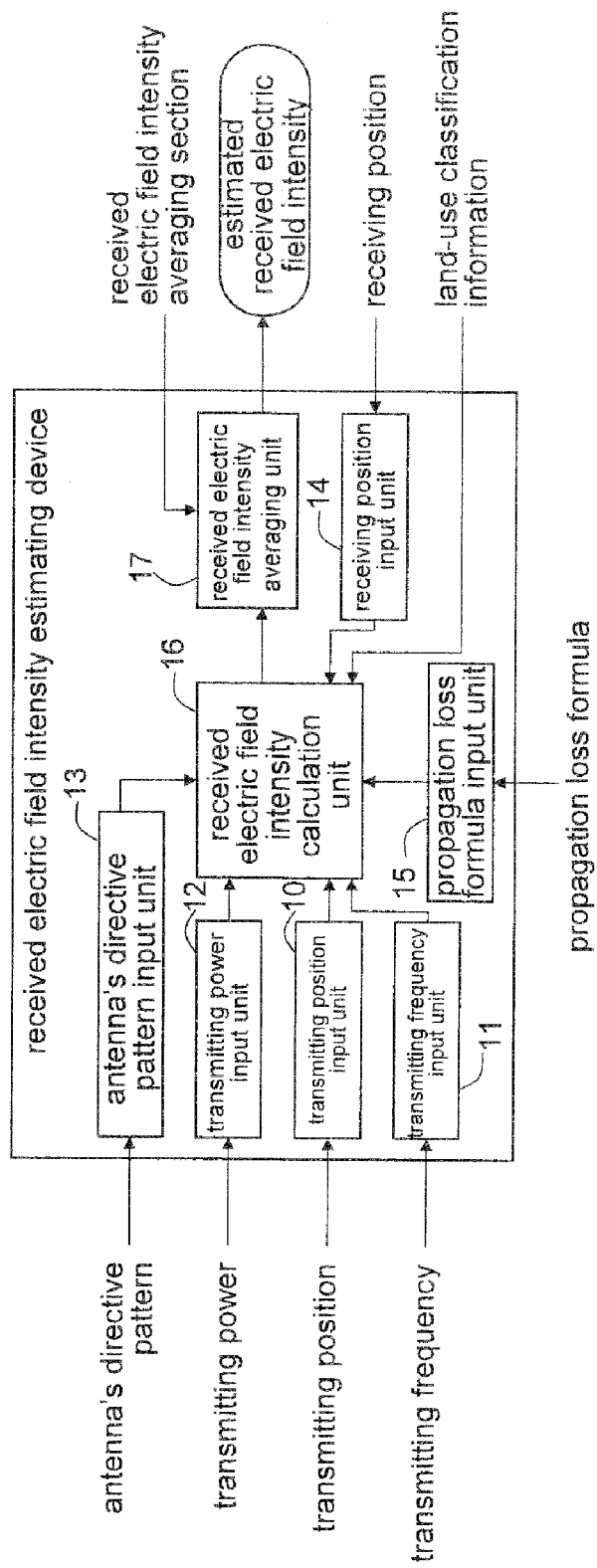
FIG. 4 A block diagram showing an example of the construction of a conventional received electric field intensity estimating device in case in which a statistical propagation model is used, for example, the Okumura-Hata Formula model.
Figure 5:
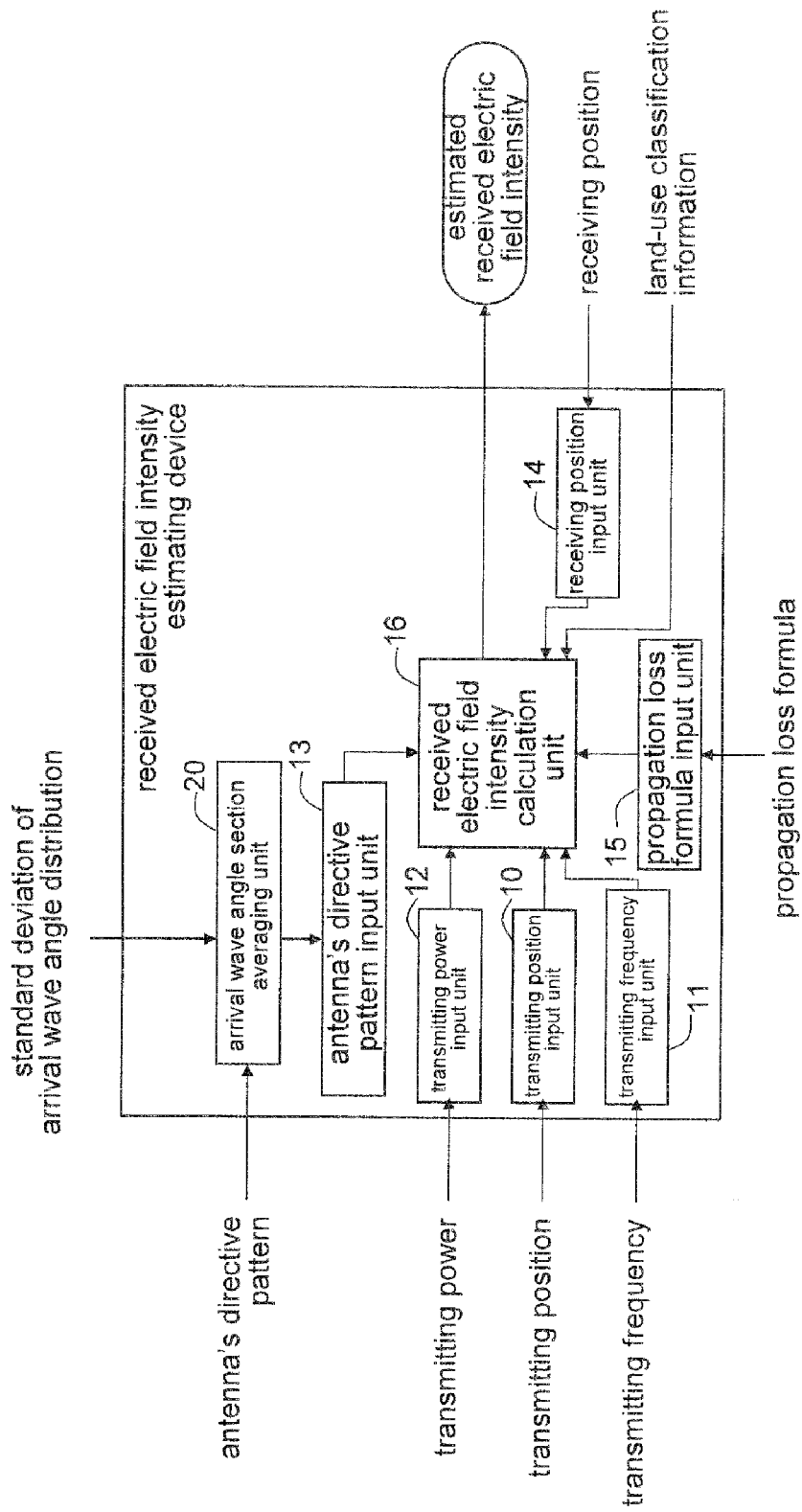
FIG. 5 A block diagram showing the construction of a received electric field intensity estimating device of first and second exemplary embodiments of the present.

FIG. 5 is a block diagram showing the construction of a received electric field intensity estimating device of the first exemplary embodiment of the present invention. In FIG. 5, the same reference numerals are provided to the corresponding elements shown in FIG. 4.

As shown in FIG. 5, a received electric field intensity estimating device of the present exemplary embodiment differs from a conventional device in that the device of the present invention is provided with arrival wave angle section averaging unit 20 in place of received electric field intensity averaging unit 17 of the conventional device shown in FIG. 4.

The present exemplary embodiment operates as follows.

Arrival wave angle section averaging unit 20 is input with an antenna's directive pattern of a transmitter's antenna and standard deviation s [degree] of the distribution of the angle of the arrival wave from an external source.

Figure 6:
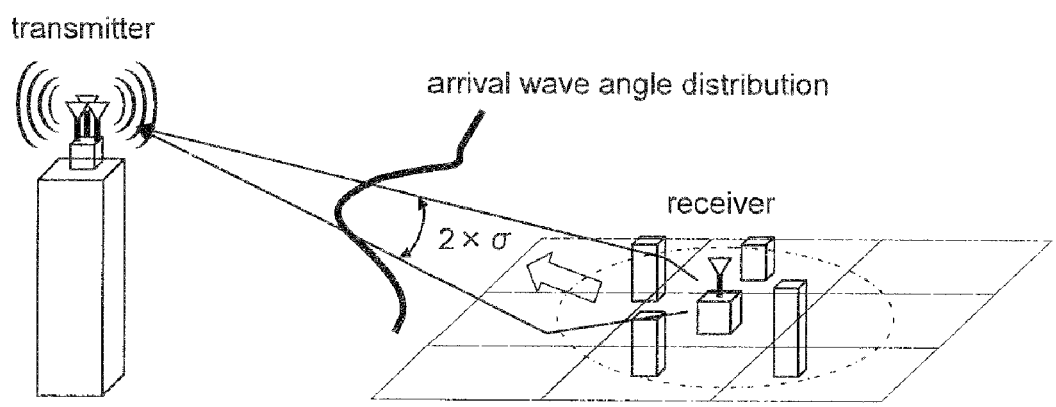
FIG. 6 A view showing an arrival wave distribution angle and an incoming of an arrival wave.

The above-mentioned distribution of the angle of the arrival wave means the distribution of received electric field intensity with respect to the arrival wave angle indicating the angle of the signal direction incoming from a transmitter to a receiver, taken as the direction from the receiver toward the transmitter. However, as shown in FIG. 6, the distribution of the angle of the arrival wave described throughout the specification of the present invention shows the arrival wave angle of the signal arriving at the transmitter in the case where the receiver transmits the signal to the transmitter. In addition, it is generally known, from a field test, that the distribution of the angle of the arrival wave is approximately a normal distribution, and therefore it is assumed that standard deviation s [degree] indicating statistical properties of the distribution of the angle of the arrival wave is input to arrival wave angle section averaging unit 20.

Arrival wave angle section averaging unit 20 obtains gain A'(θ) of an antenna's directive pattern by averaging gains A(θ) in all θ directions of the antenna's directive pattern within the section of angular range of θ±σ by using standard deviation s [degree] of distribution of the angle of the arrival wave input from the external source and by using the following equation 2.

$$A'(\theta) = (1/2\sigma) \times \int_{\theta-\sigma}^{\theta+\sigma} A(\theta) d\theta \quad \text{[Equation 2]}$$

Equation 2 is for averaging gains A(θ) by uniform weighting within the section of angular range of θ±σ, that is, equation 2 is for weighted averaging by a uniform distribution function where a weighted function is 1 in the section of angular range of θ±σ, and 0 in another range of angle.

Arrival wave angle section averaging unit 20 provides antenna's directive pattern input unit 13 with the antenna's directive pattern in which gains A(θ) are thus-processed into gain A'(θ).

Figure 7:
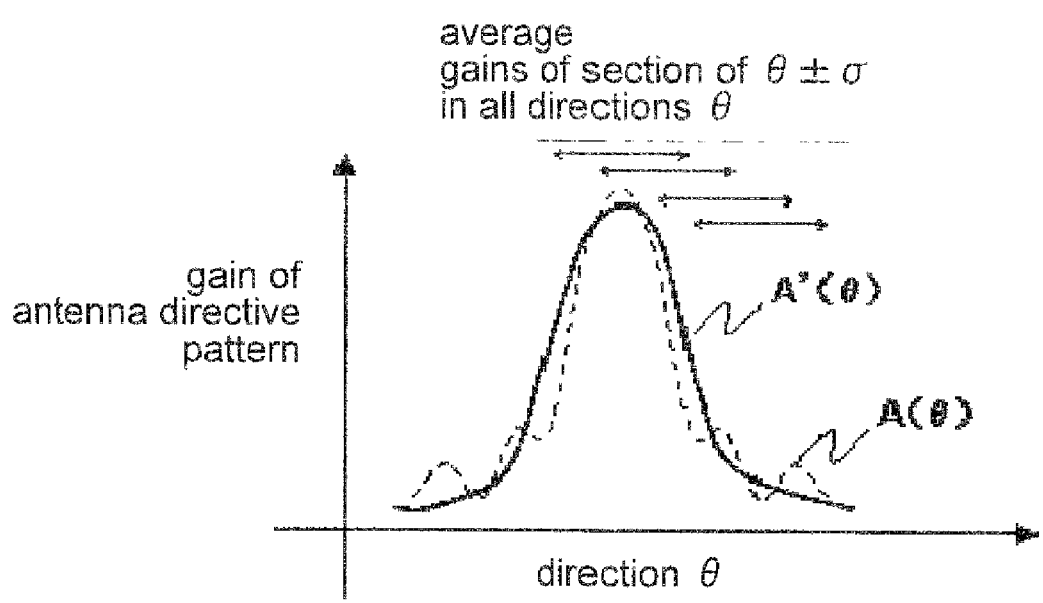
FIG. 7 A graphical representation showing an example of a directive pattern of a transmitter's antenna averaged in accordance with the first exemplary embodiment of the present invention.

FIG. 7 illustrates an example of an antenna's averaged directive pattern by equation 2. In FIG. 7, the dotted line represents gains A(θ) of the input antenna's directive pattern, and the solid line represents gain A'(θ) obtained through averaging.

Thereafter, the operation is the same as the conventional device shown in FIG. 4.

However, the present exemplary embodiment uses a propagation loss compensation value table for land-use classification information for the area around the receiver, optimized for the present exemplary embodiment, in place of that used in the conventional device This is because, in the present exemplary embodiment, the optimal compensation value table is different from that of the conventional device, since the received electric field intensity estimation is performed in a manner different from that of the conventional device.

The present exemplary embodiment is capable of estimating a received electric field intensity in which gains in reflection, diffraction and scattering directions of a transmitter's antenna are taken into consideration even without performing a plural number of calculations on rays.

This is because, the processes of the present exemplary embodiment are equal to the processes for estimating a received electric field intensity in which a plurality of rays transmitted in reflection, diffraction and scattering directions are combined to reflect antenna gains in respective directions.

The received electric field intensity estimating device of the present exemplary embodiment has the following advantages.

As a first advantage, the present exemplary embodiment eliminates the necessity of performing calculations on a plurality of rays, thereby making it possible to significantly reduce time taken for processing as compared with the conventional device which uses a deterministic propagation model that requires calculations on rays of a significantly large number of elementary waves taking into consideration reflection, diffraction and scattering caused due to the topography of the terrain and structures in the area.

As a second advantage, the present exemplary embodiment is capable of improving the accuracy of estimation as compared with the conventional device which uses a statistical propagation model where no gains in reflection, diffraction and scattering directions of a transmitter's antenna are taken into consideration.

Especially, in case where a transmitter's antenna has an antenna's directive pattern with a half amplitude, that is, in case where an antenna's directive pattern has a sharp shape, the accuracy of estimation is significantly improved by the present exemplary embodiment. That is because, in the antenna's directive pattern that has a sharp shape, there exists a large difference between the antenna gain in the directions of reflection, diffraction and scattering points and the antenna gain in the receiver direction.

As a third advantage, the received electric field intensity estimating device of the present exemplary embodiment is capable of reducing the occurrence of low accuracy of estimation in a large number of places regardless of whether a propagation model is a deterministic or statistical one, by averaging, in an arrival wave angle section, the antenna's directive pattern of the transmitter's antenna.

In a predetermined section around the receiver, there exist places in which variation of received electric field intensity is extremely large due to the topography of the terrain and structures in the area. In cases where averaging on the estimated received electric field intensity is performed in the predetermined section around the receiver as in the conventional device, the received electric field intensity is significantly affected by the extremely different received electric field intensity that exists in the predetermined section, resulting in the deterioration of accuracy of estimation in a large number of places.

The present exemplary embodiment averages a received electric field intensity in a predetermined section by averaging the gains of an antenna's directive pattern of a transmitter's antenna, differently from the conventional device in which the estimated received electric field intensity is averaged in a predetermined section.

As described above, the present exemplary embodiment is capable of reducing the occurrence of low accuracy of estimation in a large number of places in a predetermined section around the receiver, by avoiding the influence of variations of a received electric field intensity caused by the topography of the terrain and by the structures in the area.

Second Exemplary Embodiment

The second exemplary embodiment is similar to that of the first exemplary embodiment in terms of basic constitution, but differs from that of the first exemplary embodiment in terms of operation.

The present exemplary embodiment operates as follows.

Arrival wave angle section averaging unit 20 is input with an antenna's directive pattern of a transmitter's antenna and standard deviation s [degree] of distribution of the angle of the arrival wave from an external source.

Arrival wave angle section averaging unit 20 obtains gain A'(θ) of the antenna's directive pattern from gains A(θ) in θ direction of the antenna's directive pattern by using the following equation 3.

$$A'(\theta) = (1/360) \times \int_{\theta-180°}^{\theta+180°} N(x,\theta,\sigma) \cdot A(x) dx \quad \text{[Equation 3]}$$

Wherein, N(x, θ,σ) represents a normal distribution of standard deviation s [degree] taken as θ direction with respect to x direction. That is, N(x, θ,ρ) is a function for the distribution of the angle of the arrival wave.

In addition, A(x) represents gains of the antenna's directive pattern in x direction.

Equation 3 weighted averages gains of the antenna's directive pattern by the distribution of the angle of the arrival wave function.

Arrival wave angle section averaging unit 20 provides antenna's directive pattern input unit 13 with the antenna's directive pattern in which gains A(θ) are thus-processed into gain A'(θ).

The present exemplary embodiment is capable of estimating a received electric field intensity in which statistical losses caused by reflection, diffraction and scattering are taken into consideration.

As described above, distribution of the angle of the arrival wave means the distribution of received electric field intensity with respect to the arrival wave angle, and the function for distribution of the angle of the arrival wave reflects losses caused by reflection, diffraction and scattering.

By using the function for distribution of the angle of the arrival wave in a weighted function, the present exemplary embodiment is capable of estimating the received electric field intensity in which losses caused by reflection, diffraction and scattering are taken into consideration in a statistical manner.

Taking into consideration the benefits described above, the present exemplary embodiment has an advantage in addition to the advantage of first exemplary embodiment, which can be explained as follows.

The present exemplary embodiment further improves accuracy in estimating a received electric field intensity as compared with the device in the first exemplary embodiment, since the present exemplary embodiment is capable of estimating a received electric field intensity in which losses caused by reflection, diffraction and scattering are taken into consideration in a statistical manner.

Third Exemplary Embodiment

Figure 8:
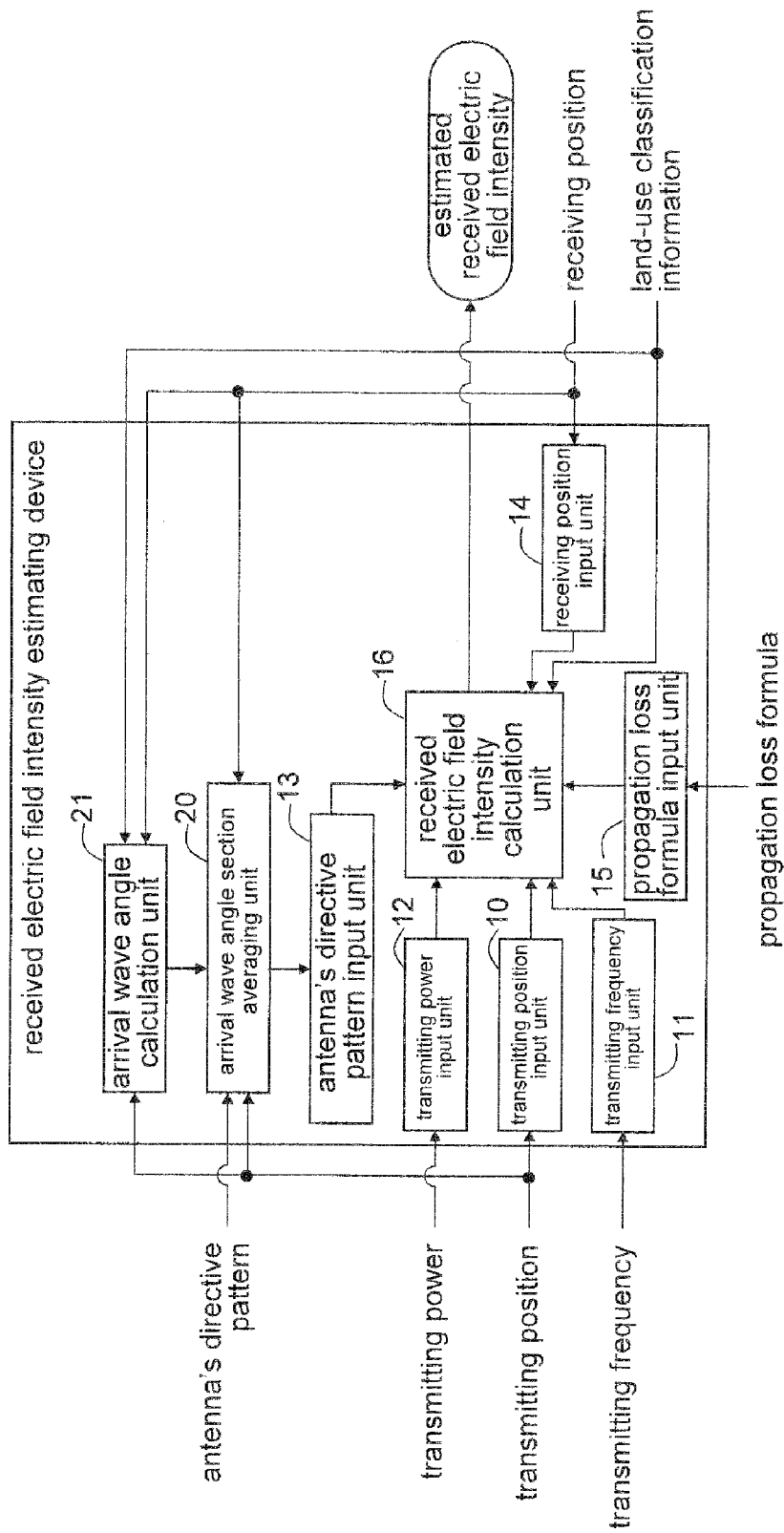
FIG. 8 A block diagram showing the construction of a received electric field intensity estimating device of the third to sixth exemplary embodiments of the present invention.

FIG. 8 is a block diagram showing the construction of a received electric field intensity estimating device of the third exemplary embodiment of the present invention. In FIG. 8, elements corresponding to those of the first and second exemplary embodiments shown in FIG. 5 are provided with the same reference numerals.

As shown in FIG. 8, a received electric field intensity estimating device of the present exemplary embodiment differs from those of the first and second exemplary embodiments shown in FIG. 5 in that the device of the present exemplary embodiment is provided with arrival wave angle calculation unit 21.

The present exemplary embodiment operates as follows.

From an external source, arrival wave angle calculation unit 21 is input with transmitting position information indicating the position of a transmitter, receiving position information indicating the position of a receiver, and land-use classification information for the area around the receiver.

First, arrival wave angle calculation unit 21 calculates ground height H[m] of the transmitting position from the ground surface based on the input transmitting position information.

Subsequently, arrival wave angle calculation unit 21 calculates distance D[m] between the transmitting position and the receiving position based on the transmitting position information and the receiving position information.

It is commonly known that the distribution of the angle of the arrival wave correlates to transmitting position height H and distance D between the transmitting position and the receiving position.

Figure 9:
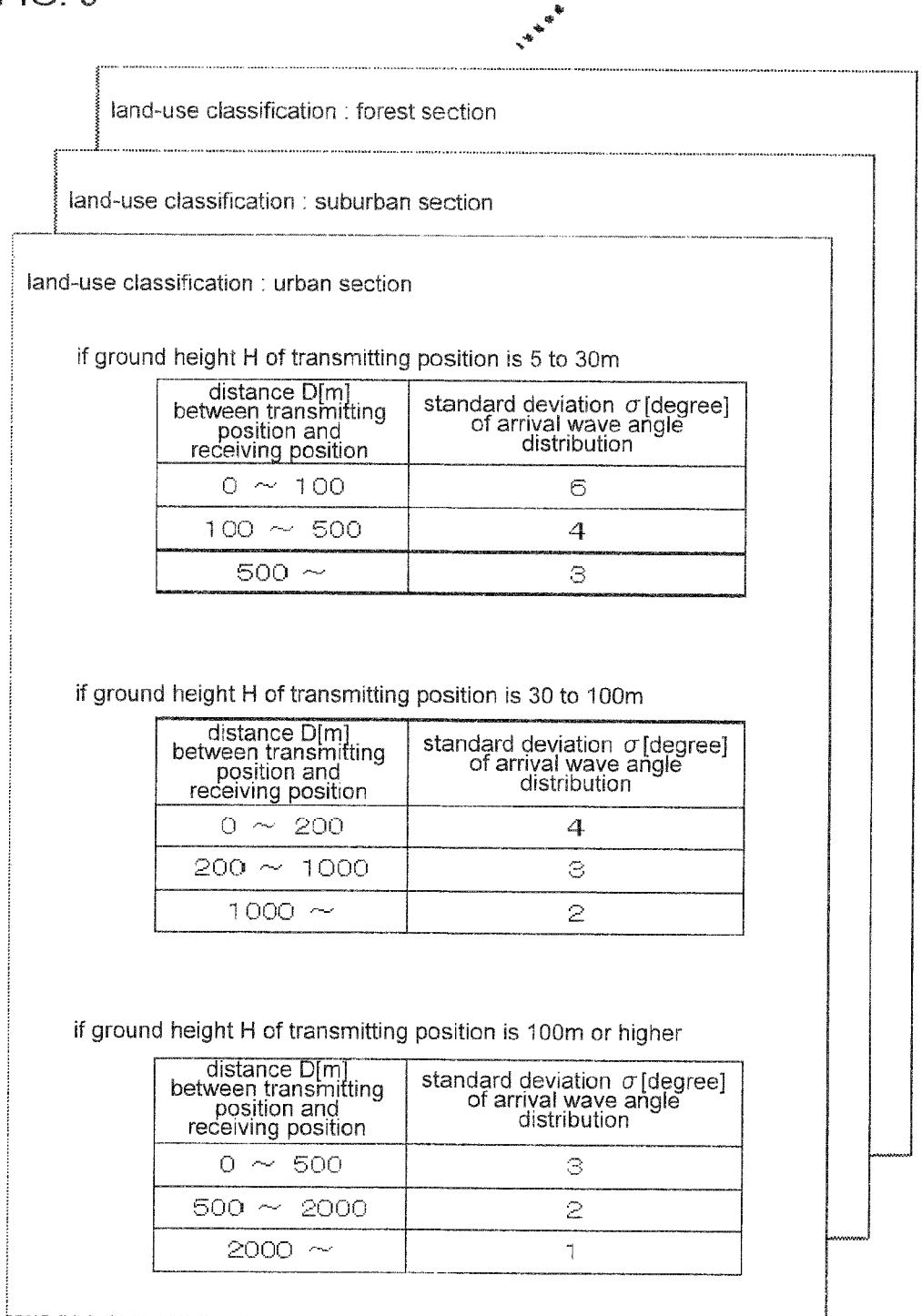
FIG. 9 A view showing a matching table for obtaining a standard deviation of the distribution of the angle of the arrival wave in third and fourth exemplary embodiments of the present invention.

Therefore, arrival wave angle calculation unit 21 obtains standard deviation s [degree] of distribution of the angle of the arrival wave, based on the matching table (refer to the matching table shown in FIG. 9) for land-use classification information for the area around the receiver, ground height H[m] of the transmitting position, distance D[m] between the transmitting position and the receiving position, and the standard deviation of the distribution of the angle of the arrival wave.

Finally, arrival wave angle calculation unit 21 provides arrival wave angle section averaging unit 20 with thus-obtained standard deviation s [degree] of the distribution of the angle of the arrival wave.

From an external source, arrival wave angle section averaging unit 20 is input with transmitting position information, receiving position information and antenna's directive pattern of a transmitter's antenna. In addition, arrival wave angle section averaging unit 20 is provided with standard deviation s [degree] of the distribution of the angle of the arrival wave input from arrival wave angle calculation unit 21.

First, arrival wave angle section averaging unit 20 obtains transmitting direction θo [degree] indicating the direction of the receiver viewed from a transmitter's side, by using transmitting position information and receiving position information.

Subsequently, by using standard deviation s of the distribution of the angle of the arrival wave input from arrival wave angle calculation unit 21, thus-obtained transmitting direction θo and the following equation 4, arrival wave angle section averaging unit 20 averages gains A(θo) in direction θo of the antenna's directive pattern within the section of angular range of θo±σ to obtain gain A'(θo) of the antenna's directive pattern.

$$A'(\theta_o) = (1/2\sigma) \times \int_{\theta_o - \sigma}^{\theta_o + \sigma} A(x) dx \qquad \text{[Equation 4]}$$

As a final step, arrival wave angle section averaging unit 20 provides antenna's directive pattern input unit 13 with the antenna's directive pattern in which gains A(θo) are averaged into gain A'(θo).

The present exemplary embodiment has an advantage in which the standard deviation of arrival wave angle is set in accordance with transmitting position information, receiving position information and land-use classification information for the area around the receiver.

The present exemplary embodiment has another advantage in which antenna gains are processed in direction θo from the transmitting position toward the receiving position in sequences according to the receiving position.

The present exemplary embodiment has an advantage in addition to the advantage of the first exemplary embodiment, which can be explained as follows.

The present exemplary embodiment further improves accuracy in estimating a received electric field intensity as compared with the device in the first exemplary embodiment because the present exemplary embodiment allows the standard deviation of arrival wave angle and antenna gains in the direction of the receiver to be set in sequences in accordance with the position of the receiver to thereby achieve more realistic modeling.

Fourth Exemplary Embodiment

The fourth exemplary embodiment has the basic construction identical to that of third exemplary embodiment, but differs in operation.

The present exemplary embodiment operates as follows.

Arrival wave angle calculation unit 21 operates in the same manner as that of the third exemplary embodiment.

Arrival wave angle section averaging unit 20 obtains gain A'(θo) of the antenna's directive pattern by using the following equation 5 in place of equation 4 of the third exemplary embodiment.

$$A'(\theta_o) = (1/360) \times \int_{\theta_o - 180°}^{\theta_o + 180°} N(x, \theta, \sigma) \cdot A(x) dx \qquad \text{[Equation 5]}$$

Then, arrival wave angle section averaging unit 20 provides antenna's directive pattern input unit 13 with the antenna's directive pattern in which gains A(θo) are averaged into gain A'(θo).

The present exemplary embodiment has the same advantages as those of the third exemplary embodiment.

The present exemplary embodiment has an advantage in addition to that of the second exemplary embodiment, which can be explained as follows.

The present exemplary embodiment further improves accuracy in estimating a received electric field intensity as compared with the device in the second exemplary embodiment.

Fifth Exemplary Embodiment

The fifth exemplary embodiment has the basic construction identical to that of the third exemplary embodiment, but operates in a different manner from the third exemplary embodiment.

The present exemplary embodiment operates as follows.

From an external source, arrival wave angle calculation unit 21 is input with transmitting position information, receiving position information, and land-use classification information for the area around the receiver.

First, arrival wave angle calculation unit 21 calculates ground height H[m] of the transmitting position (from the ground surface) based on the input transmitting position information.

Subsequently, arrival wave angle calculation unit 21 calculates distance D[m] between the transmitting position and the receiving position based on the transmitting position information and the receiving position information.

Figure 10:
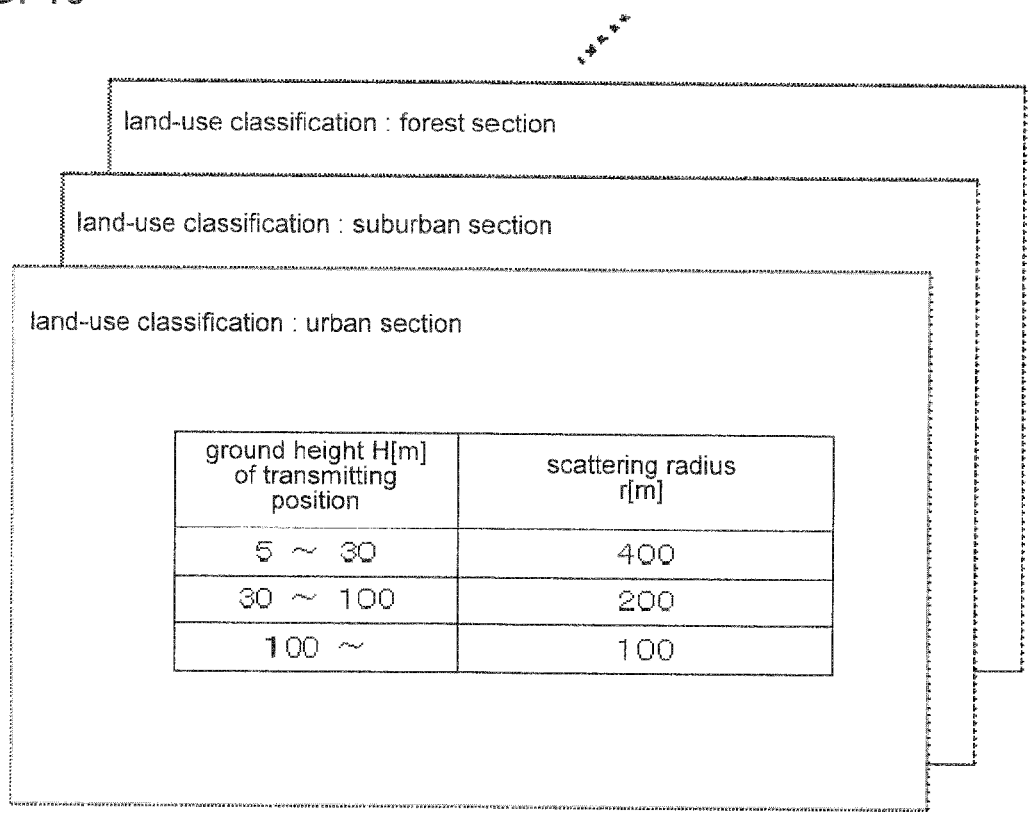
FIG. 10 A view showing a matching table of scattering radius for obtaining a standard deviation of the distribution of the angle of the arrival wave in fifth and sixth exemplary embodiments of the present invention.

Subsequently, by referring to the matching table shown in FIG. 10, arrival wave angle calculation unit 21 obtains scattering radius r[m] matched to the land-use classification information for the area around the receiver and ground height H[m] of the transmitting position.

Subsequently, arrival wave angle calculation unit 21 obtains standard deviation s of the distribution of the angle of the arrival wave by using the following equation 6.

$$\sigma = \tan^{-1}(r/D) \qquad \text{[Equation 6]}$$

As a final step, arrival wave angle calculation unit 21 provides arrival wave angle section averaging unit 20 with standard deviation s calculated according to the equation 6.

Arrival wave angle section averaging unit 20 operates in the same manner as that of the third exemplary embodiment.

The present exemplary embodiment has the same advantages as those of the third exemplary embodiment.

Sixth Exemplary Embodiment

The sixth exemplary embodiment has the basic construction identical to that of the third exemplary embodiment, but operates in a different manner from the third exemplary embodiment.

The present exemplary embodiment operates as follows.

Arrival wave angle calculation unit 21 operates in the same fashion as that of the fifth exemplary embodiment.

Arrival wave angle averaging unit 20 operates in the same fashion as that of the fourth exemplary embodiment.

The present exemplary embodiment has the same advantages as those of the fourth exemplary embodiment.

While the received electric field intensity estimating device in the first to sixth exemplary embodiments has been illustrated and described, for mere convenience of explanation, as operating only when the angle of the antenna's directive pattern exists within a horizontal plane, however, in cases where the angle of the antenna's directive pattern exists within a vertical plane, the present invention operates in the same manner as the foregoing description and achieves the same advantages as the foregoing text.

Moreover, it is apparent that the first to sixth exemplary embodiments are configured in such a manner that the operating sequence of the device is stored in advance, as a program, in a recording medium, for example, ROM, and read into a computer for execution.

The described exemplary embodiments are illustrative only and are not intended to be limiting. It can be appreciated by those of ordinary skill in the art to which embodiments of the invention pertain that various modifications may be made without deviating from the scope of the present invention.

This application claims priority based on Japanese Patent Application No. 2006-349585 filed Dec. 26, 2006, the disclosures of which are incorporated herein by reference.

The invention claimed is:

1. A received electric field intensity estimating method for estimating a received electric field intensity at a time when a signal transmitted from a transmitter is received by a receiver, by using at least a gain in a transmitting direction indicating a direction of the receiver viewed from a transmitter side from among gains in individual directions of a directive pattern of an antenna of the transmitter, the received electric field intensity estimating method comprising:
   averaging gains in the individual directions of the directive pattern of the antenna within an angular range of an arrival wave angle indicating a direction of the signal arriving at the transmitter from the receiver, taken as the relevant direction, the averaging being weighted averaging using a weighted function, the weighted function being a uniform distribution function; and
   calculating the received electric field intensity by using at least the gain in the transmitting direction from among gains in the individual directions of the averaged directive pattern of the antenna.

2. The received electric field intensity estimating method according to claim 1, wherein the weighted function is a function for the distribution of the angle of the arrival wave indicating a distribution of received electric field intensity with respect to the arrival wave angle.

3. The received electric field intensity estimating method according to claim 1, wherein the arrival wave angle is determined to be related to land-use classification information for an area around the receiver.

4. The received electric field intensity estimating method according to claim 1, wherein the arrival wave angle is determined by a scattering radius.

5. A received electric field intensity estimating device for estimating a received electric field intensity at a time when a signal transmitted from a transmitter is received by a receiver, by using at least a gain in a transmitting direction indicating a direction of the receiver viewed from a transmitter side from among gains in individual directions of a directive pattern of an antenna of the transmitter, the received electric field intensity estimating device comprising:
   an averaging unit configured to average gains in the individual directions of the directive pattern of the antenna within an angular range of an arrival wave angle indicating a direction of the signal arriving at the transmitter from the receiver, taken as the relevant direction, the averaging being weighted averaging using a weighted function, the weighted function being a uniform distribution function;
   a received electric field calculation unit configured to calculate the received electric field intensity by using at least the gain in the transmitting direction from among gains in the individual directions of the averaged directive pattern of the antenna; and
   one or more processing devices configured to cause one or more of the averaging unit and the calculation unit to average the gains and calculate the received electric field intensity, respectively.

6. The received electric field intensity estimating device according to claim 5, wherein the weighted function is a function for the distribution of the angle of the arrival wave indicating a distribution of received electric field intensity with respect to the arrival wave angle.

7. The received electric field intensity estimating device according to claim 5, wherein the arrival wave angle is determined to be related to land-use classification information for an area around the receiver.

8. The received electric field intensity estimating device according to claim 5, wherein the arrival wave angle is determined by a scattering radius.

* * * * *